United States Patent
Nielson et al.

(10) Patent No.: US 8,736,108 B1
(45) Date of Patent: May 27, 2014

(54) PHOTOVOLTAIC SYSTEM

(75) Inventors: Gregory N. Nielson, Albuquerque, NM (US); Murat Okandan, Edgewood, NM (US); Anthony L. Lentine, Albuquerque, NM (US); William C. Sweatt, Albuquerque, NM (US); Paul Gilbert Clem, Albuquerque, NM (US); Sean J. Hearne, Albuquerque, NM (US); Paul Davids, Albuquerque, NM (US); Dale L. Huber, Albuquerque, NM (US); Jeffrey S. Nelson, Albuquerque, NM (US); Christopher Alan Apblett, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 490 days.

(21) Appl. No.: 13/164,483

(22) Filed: Jun. 20, 2011

Related U.S. Application Data

(63) Continuation-in-part of application No. 12/914,441, filed on Oct. 28, 2010, which is a continuation-in-part of application No. 11/933,458, filed on Nov. 1, 2007, and a continuation-in-part of application No. 12/957,082, filed on Nov. 30, 2010, now Pat. No. 8,329,503, which is a continuation-in-part of application No. 11/933,458, filed on Nov. 1, 2007.

(51) Int. Cl.
*H02J 1/10* (2006.01)
(52) U.S. Cl.
USPC .......................................................... 307/43
(58) Field of Classification Search
USPC .......................................................... 307/43
See application file for complete search history.

(56) References Cited

U.S. PATENT DOCUMENTS

| | | | |
|---|---|---|---|
| 5,593,901 | A | 1/1997 | Oswald et al. |
| 5,720,452 | A | 2/1998 | Mutschler, Jr. et al. |
| 6,225,793 | B1 | 5/2001 | Dickmann |
| 7,521,630 | B2 | 4/2009 | Ball |
| 7,709,727 | B2 | 5/2010 | Roehrig et al. |
| 2011/0005569 | A1 | 1/2011 | Sauar et al. |
| 2012/0175963 | A1* | 7/2012 | Adest et al. ............... 307/82 |

OTHER PUBLICATIONS

Sweatt, et al., "Micro-Optics for High-Efficiency Optical Performance and Simplified Tracking for Concentrated Photovoltaics (CPV)", International Optical Design Conference (IODC), Jul. 13, 2010. pp. 1-8.
Johnson, et al., "Photovoltaic AC Module Composed of a Very Large Number of Interleaved Inverters", Applied Power Electronics Conference and Exposition (APEC), 2011 Twenty-Sixth Annual IEEE, Mar. 2011. pp. 976-981.
Gee, et al., "The Potential Performance of GaAs-based Mechanically Slacked Multijunction Solar Concentrator Cells," Photovoltaic Specialists Conference, 1990., Conference Record of the Twenty First IEEE, 1990. pp. 41-46.

* cited by examiner

*Primary Examiner* — Robert L. Deberadinis
(74) *Attorney, Agent, or Firm* — Medley Behrens & Lewis LLC; Michael J. Medley

(57) ABSTRACT

A photovoltaic system described herein includes a first group of photovoltaic modules that comprises a first plurality of microsystem enabled photovoltaic modules. A second group of photovoltaic modules comprises a second plurality of microsystem enabled photovoltaic modules, wherein the first group of photovoltaic modules are electrically connected in parallel to the second group of photovoltaic modules.

19 Claims, 5 Drawing Sheets

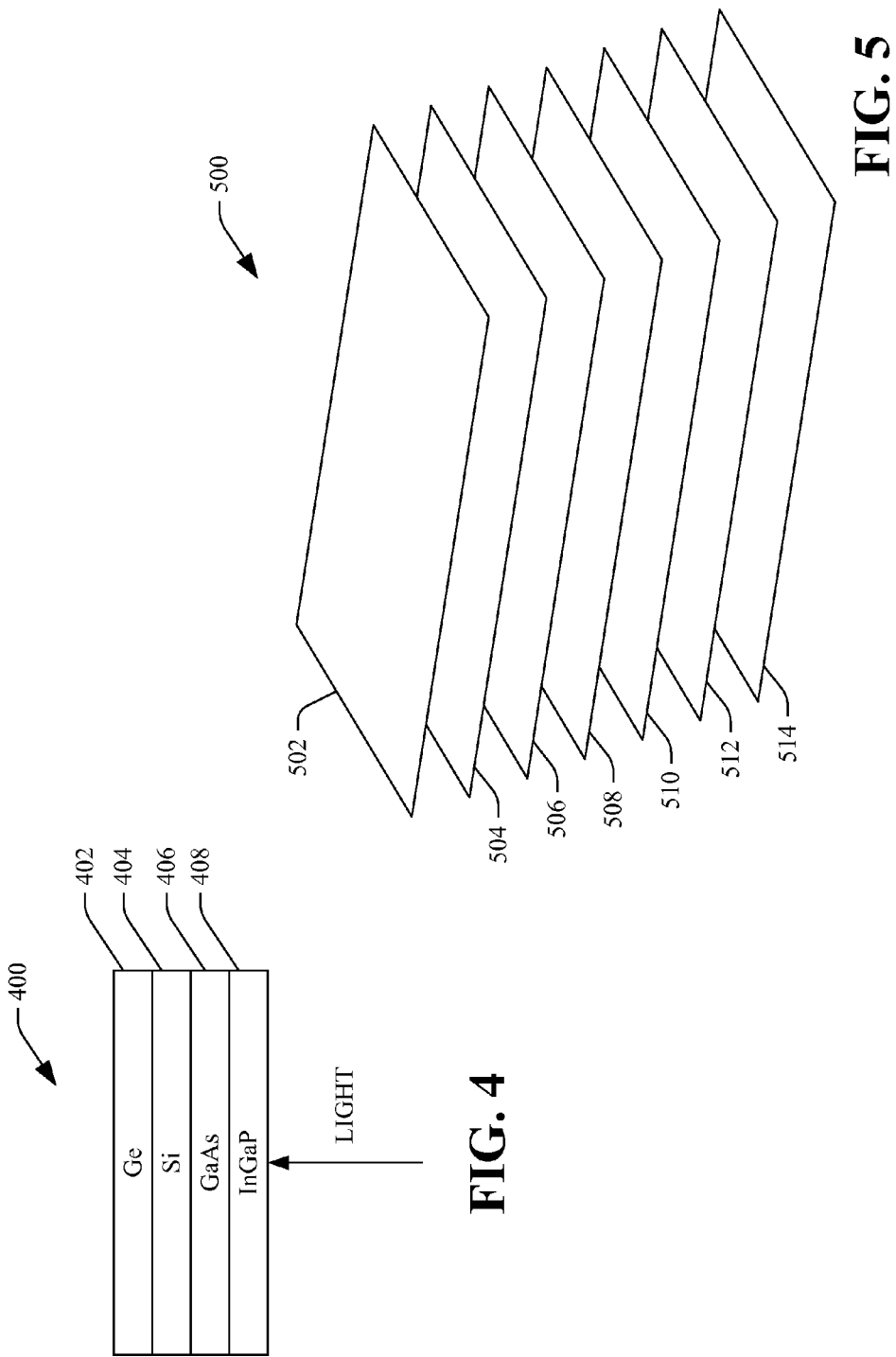

PHOTOVOLTAIC SYSTEM

CROSS-REFERENCE TO RELATED APPLICATIONS

This application is a continuation-in-part of U.S. patent application Ser. No. 12/914,441, filed on Oct. 28, 2010, which is a continuation-in-part of U.S. patent application Ser. No. 11/933,458, filed on Nov. 1, 2007. This application is additionally a continuation-in-part of U.S. patent application Ser. No. 12/957,082, filed on Nov. 30, 2010, now U.S. Pat. No. 8,329,503 which is also a continuation-in-part of U.S. patent application Ser. No. 11/933,458, filed on Nov. 1, 2007. The entireties of these applications are incorporated herein by reference.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Environmental concerns pertaining to utilization of fossil fuels to generate electrical power together with the non-renewable nature of such fossil fuels have increased demand for alternative energy sources. Exemplary electrical power systems that utilize renewable energy resources include solar power systems, wind power systems, hydroelectric power systems, geothermal power systems, amongst others.

Conventional solar power systems, particularly those utilized to provide electrical power to a residence, include solar panels that comprise a plurality of relatively large silicon photovoltaic cells (e.g., approximately six inches by six inches). The solar cells are manufactured to output a certain voltage (regardless of an amount of solar radiation of particular wavelengths received at the solar cells). In an example, a conventional photovoltaic system can include a relatively small number (e.g., 100) of large cells. The cells are arranged in columns, and cells in the columns are connected in series to multiply the voltage from the individual cells to get a module of 10s of volts (e.g., 36 volts).

In a residential photovoltaic system installation, several columns are connected in series to obtain a voltage of approximately 200 volts, which is substantially optimal for commercial inverters. Series connected photovoltaic cells generate a voltage that is approximately equal to the sum of the voltages of the individual cells, but the current is approximately equal to the minimum current output by any of the photovoltaic cells. Since the current of a photovoltaic cell is proportional to the light that is incident on the cell, if one cell of a series connection receives a low light level, the entire series connection has a low current. Thus, a typical solar power system configuration that includes multiple columns can have a severe current reduction (and power output) when one cell or a portion of a cell has a low light level (e.g., due to shading). Oftentimes, when photovoltaic systems are installed on residences or other buildings, trees or other obstructions may be nearby, and accordingly shading of at least a portion of a module can occur frequently.

SUMMARY

The following is a brief summary of subject matter that is described in greater detail herein. This summary is not intended to be limiting as to the scope of the claims.

Described herein are various technologies pertaining to photovoltaic power generation systems. More particularly, photovoltaic power generation systems that comprise a plurality of microsystem enabled photovoltaic modules that are selectively arranged in series and parallel are described herein. A photovoltaic power generation system includes a solar panel that is configured to receive solar radiation and convert such solar radiation to electric power. In an exemplary embodiment, the solar panel includes a plurality of microsystem enabled photovoltaic modules, wherein each photovoltaic module comprises a plurality of photovoltaic cells. The photovoltaic cells in the photovoltaic module are electrically connected in series with one another to obtain a desired output voltage for the photovoltaic module. The photovoltaic modules are selectively electrically connected with one another in series and parallel; accordingly, partial shading of one of the modules does not drastically impact power generated by another one of the modules.

Pursuant to an example, a photovoltaic module can include a plurality of multi-junction cells, wherein a multi-junction cell comprises a plurality of stacked photovoltaic cells, and wherein the photovoltaic cells in the multi-junction cell have differing bandgaps and differing operating voltages. Photovoltaic cells of the same type (same operating voltage) can be selectively connected in series, wherein photovoltaic cells connected in series (regardless of type of photovoltaic cell) produce substantially similar (e.g., within 10%) output voltages. For instance, the multi junction cells in a photovoltaic module can include Silicon cells and Gallium Arsenide cells, which have operating voltages of 0.57 volts and 0.9 volts, respectively. Accordingly, 18 Silicon cells can be connected in series while 12 Gallium Arsenide cells can be connected in series, resulting in output voltages of 10.26 and 10.8 volts, respectively. For example, the Gallium Arsenide cells can then be connected in parallel with the Silicon cells. A plurality of photovoltaic modules may then be coupled in series with one another to obtain a desired output voltage. For instance, a photovoltaic module group can comprise twenty serially connected photovoltaic modules, resulting in an output voltage of approximately 200 V from the photovoltaic module group. A plurality of photovoltaic module groups can then be coupled in parallel, such that shading over a particular module or group of modules causes current output from the photovoltaic system to be affected relative to the portion of the solar panel that is shaded.

Also described herein are various technologies pertaining to harvesting energy through renewable energy resources, including solar radiation. For example, a relatively thin device can be generated that comprises thin film batteries that can act to retain energy as well as dissipate energy. The device can further include a plurality of photovoltaic modules, such as the microsystem enabled photovoltaic modules referenced above, to generate electrical power responsive to receipt of light, and the thin film batteries can retain energy generated by the photovoltaic modules. Additionally, the device may comprise one or more rectifying antennas that are configured to generate energy responsive to receipt of at least one of infrared energy from the surface of the earth or microwaves received from terrestrial sources.

Other aspects will be appreciated upon reading and understanding the attached figures and description.

BRIEF DESCRIPTION OF THE DRAWINGS

FIG. 4 is a cutaway view of an exemplary photovoltaic cell.

FIG. 5 is an exemplary power system for providing continuous power to an electromechanical device.

DETAILED DESCRIPTION

Figure 1:
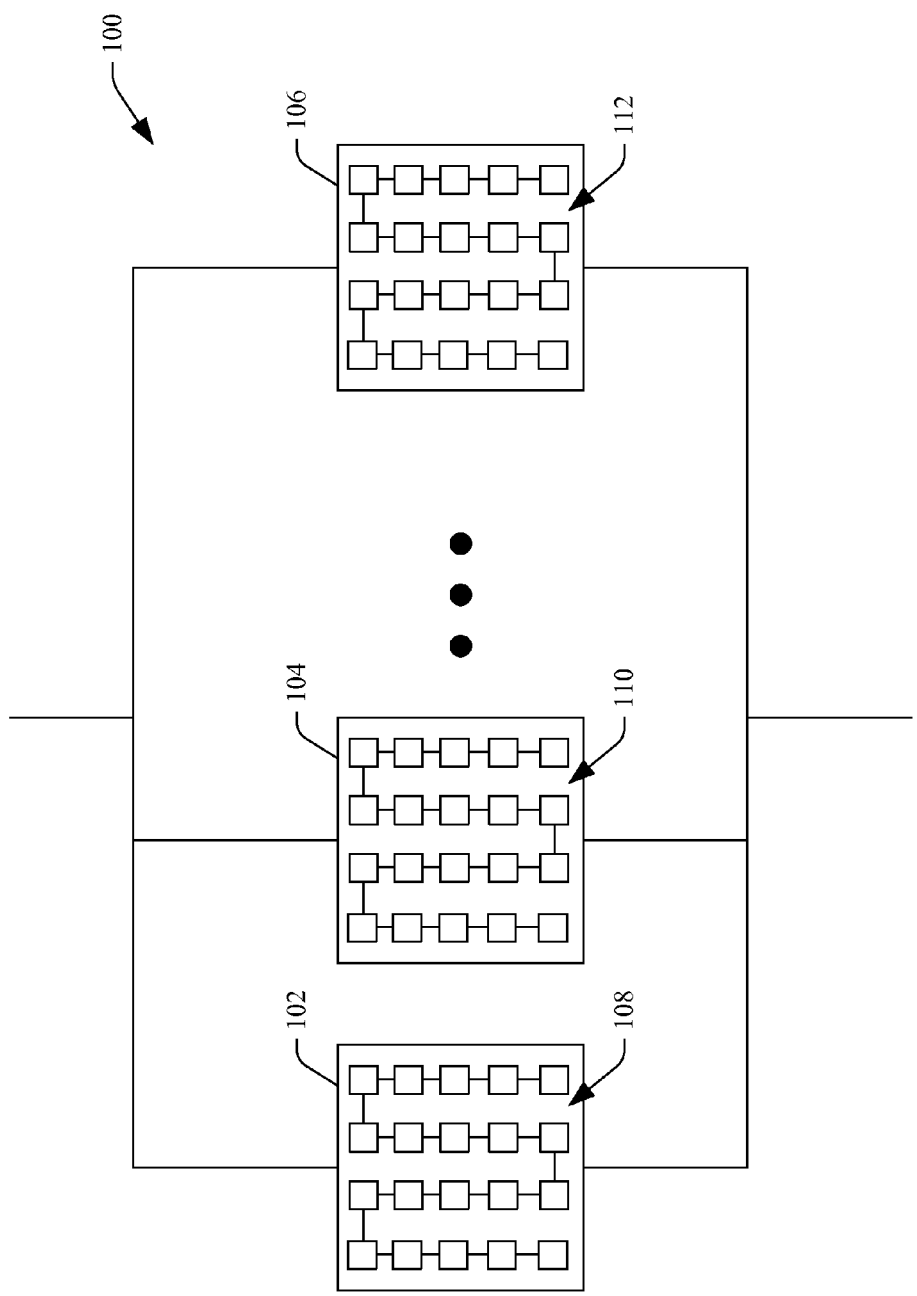
FIG. 1 is a schematic diagram of an exemplary photovoltaic system.

Various technologies pertaining to photovoltaic systems will now be described with reference to the drawings, where like reference numerals represent like elements throughout. As used herein, the term "exemplary" is intended to mean serving as an illustration or example of something, and is not intended to indicate a preference. Further, as used herein, the terms "approximately" and "similar", when used with respect to certain variables or values, are intended to encompass a range of ten percent from a specified value or variable. Moreover, the term "photovoltaic cell" when used herein, is intended to encompass a portion of a multi-junction photovoltaic cell as well as a single junction photovoltaic cell. Additionally, the term "module" is intended to refer to a portion of a solar panel that comprises a plurality of photovoltaic cells.

With reference to FIG. 1, an exemplary photovoltaic system 100 is illustrated. The photovoltaic system 100 comprises a plurality of photovoltaic module groups 102-106, wherein each of the photovoltaic module groups 102-106 have similar output voltages. Pursuant to an example, the output voltages of the photovoltaic module groups 102-106 can be approximately 200 volts.

Each of the photovoltaic module groups 102-106 comprises a plurality of photovoltaic modules that are electrically connected in series with one another to generate the desired output voltage. In an example, the photovoltaic modules can be approximately 5 cm by 5 cm in size. In another example, the photovoltaic modules can be approximately 4 cm by 4 cm in size. In still yet another example, the photovoltaic modules can be approximately 4 cm by 5 cm in size.

The first photovoltaic module group 102 can comprise a first plurality of photovoltaic modules (collectively shown as reference numeral 108), the second photovoltaic module group 104 can comprise a second plurality of photovoltaic modules (collectively shown as reference numeral 110), and the Nth photovoltaic module group 106 can comprise an Nth plurality of photovoltaic modules (collectively shown as reference numeral 112). The photovoltaic modules 108 in the first photovoltaic module group 102 are connected in series with one another, the photovoltaic modules 110 in the second photovoltaic module group 104 are connected in series with one another, and the photovoltaic modules 112 in the Nth photovoltaic module group 106 are connected in series with one another. The output voltage of each photovoltaic module can be approximately 10 volts. Therefore, in an example, the photovoltaic module groups 102-106 can each comprise twenty photovoltaic modules.

The photovoltaic module groups 102-106 are connected in parallel with one another. Therefore, continuing with the example set forth above, the output voltage of the collection of photovoltaic module groups 102-106 is approximately 200 volts. As the photovoltaic module groups 102-106 are connected in parallel with one another, shading of a portion of any one of the module groups 102-106 does not drastically decrease the current output by the photovoltaic system 100. Rather, any reduction in current output by the photovoltaic system 100 is approximately proportional to an amount of shading of the portion of a photovoltaic module group.

As will be described in greater detail below, the photovoltaic modules 108-112 can be microsystem enabled photovoltaic modules that include numerous thin (0.1-50 μm thick), small (100 μm-10 mm laterally) photovoltaic cells that are built using micro-fabrication concepts. For example, the following references, which are incorporated herein by reference, describe the building of photovoltaic modules that comprise numerous photovoltaic cells using micro-fabrication techniques: Nielson, et al., "Microscale C-SI © PV Cells for Low-Cost Power", 34$^{th}$ IEEE Photovoltaic Specialist Conference, Jun. 7-10 2009, Philadelphia, Pa., 978-1-4244-2950/90, and Nielsen, et al., "Microscale PV Cells for Concentrated PV Applications," 24$^{th}$ European Photovoltaic Solar Energy Conference, Sep. 21-25, 2009, Hamburg, Germany 3-936338-25-6. In summary, these references describe one sun and concentrating systems with integrated micro-optical lenses, and further describe relatively thin cells that have been fabricated using epitaxial lift-off in Silicon and Gallium Arsenide with efficiencies exceeding 10%. Heterogeneously integrating (e.g., vertically stacking) different cell types with dielectric layers therebetween can yield high performance multi-junction cells, where a designer of the photovoltaic modules is free from lattice matching and series connection constraints of monolithic cells.

The size and efficiencies of the multi-junction photovoltaic cells allows for placement of several photovoltaic module groups in parallel with one another while retaining a desired output voltage. For example, a size of a photovoltaic module group can be approximately 100 cm by 100 cm. Therefore, several photovoltaic module groups can be placed, for instance, on a roof of a building in parallel while having a desired output voltage (e.g., 200 volts).

Figure 2:
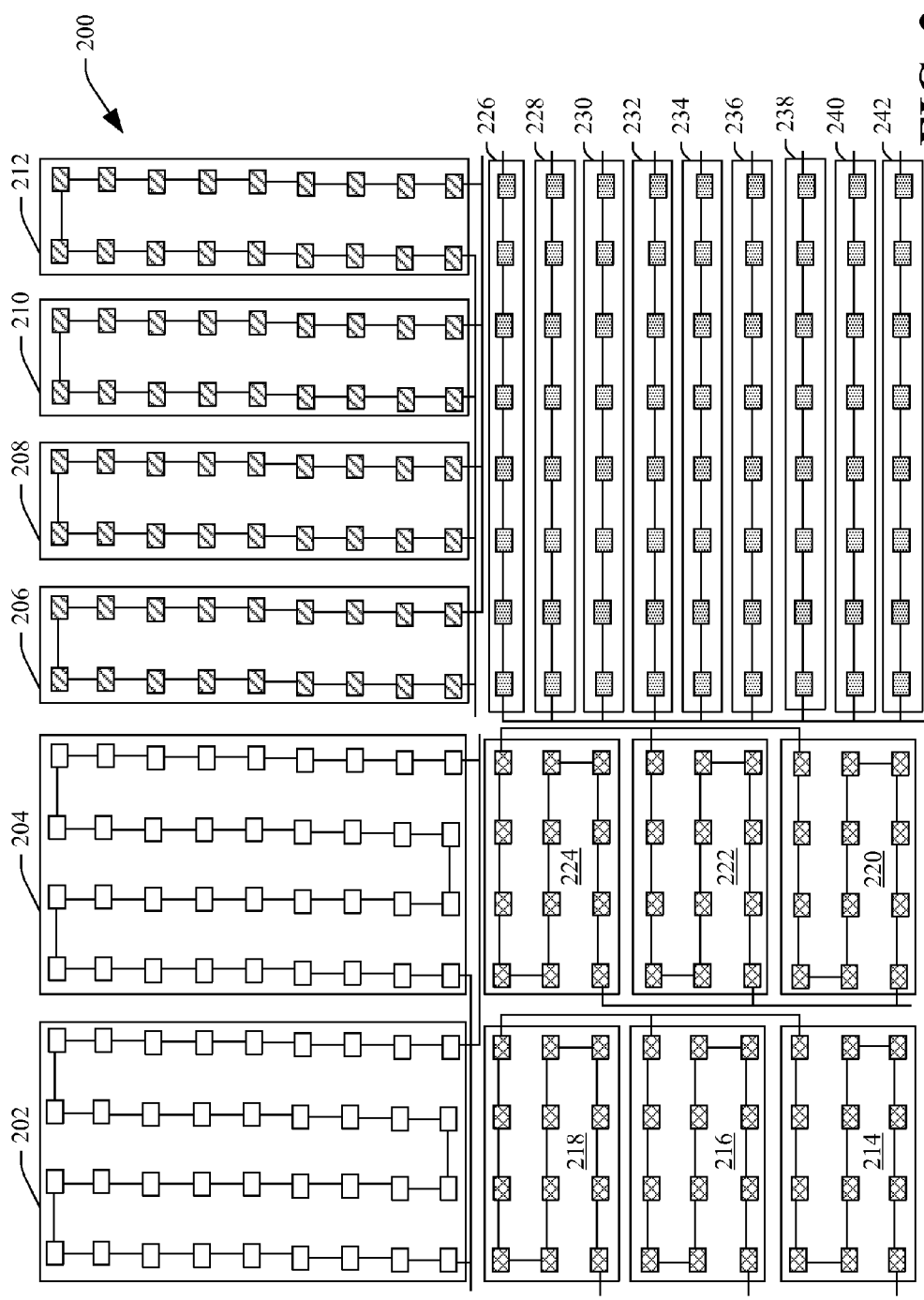
FIG. 2 is a schematic diagram of an exemplary photovoltaic module.

Now referring to FIG. 2, an exemplary photovoltaic module 200 that can be included in the photovoltaic module groups 102-106 is illustrated. Pursuant to an example, the photovoltaic module 200 can comprise a plurality of multi-junction photovoltaic cells, such that each multi junction photovoltaic cell comprises a plurality of photovoltaic cells. Pursuant to an example, each multi-junction photovoltaic cell can comprise a Silicon photovoltaic cell and a III-V photovoltaic cell. In a more specific example, each multi-junction photovoltaic cell can comprise a Germanium (Ge) photovoltaic cell, a Silicon (Si) photovoltaic cell, a Gallium Arsenide (GaAs) photovoltaic cell, and an Indium Gallium Phosphorous (InGaP) photovoltaic cell.

The exemplary photovoltaic module 200 comprises 72 multi-junction photovoltaic cells, wherein each of the multi-junction photovoltaic cells comprises a Ge, cell, an Si cell, a GaAs cell, and an InGaP cell. These different cells are shown as laid out adjacent to one another; however, such layout is for purposes of explanation. As indicated above, the cells in the multi-junction cells are stacked on top of one another.

The photovoltaic module 200 comprises different numbers of each cell type connected in series (to create a string) to arrive at similar intermediate (higher) voltage. These strings can be connected in parallel to effectively add currents. In an example, a desired intermediate voltage may be approximately 10 V, and a Ge cell may have an operating voltage of approximately 0.3 volts, a Si cell may have an operating voltage of approximately 0.57 volts, a GaAs cell may have an operating voltage of approximately 0.9 volts, and an InGaP cell may have an operating voltage of approximately 1.3 volts. Therefore, the photovoltaic module 200 can comprise a first string of Ge cells 202 and a second string of Ge cells 204 that each comprise 36 cells connected in series. Accordingly, each of the first string of Ge cells 202 and the second string of Ge cells 204 outputs approximately 10.8 volts.

The exemplary photovoltaic module 200 further comprises a first string of Si cells 206, a second string of Si cells 208, a third string of Si cells 210, and a fourth string of Si cells 212. Each of these strings of Si cells 206-212 can comprise 18 cells connected in series, resulting in each string outputting approximately 10.26 volts.

The module 200 can additionally comprise a first string of GaAs cells 214, a second string of GaAs cells 216, a third string of GaAs cells 218, a fourth string of GaAs cells 220, a fifth string of GaAs cells 222, and a sixth string of GaAs cells 224. Each of the strings of GaAs cells 214 can comprise 12 cells connected in series, resulting in each string of GaAs cells outputting approximately 10.8 volts.

Further, the module 200 can also comprise a first string of InGaP cells 226, a second string of InGaP cells 228, a third string of InGaP cells 230, a fourth string of InGaP cells 232, a fifth string of InGaP cells 234, a sixth string of InGaP cells 236, a seventh string of InGaP cells 238, an eighth string of InGaP cells 240, and a ninth string of InGaP cells 242. Each of the strings of InGaP cells can comprise 8 cells connected in series, resulting in each string of InGaP cells outputting approximately 10.4 volts.

Accordingly, an intermediate operating voltage for each string of cells can be approximately 10 volts. It can be ascertained that the voltages don't exactly match, and accordingly the voltage output by the module 200 will be the lowest voltage of the series connections (10.26 volts). To improve efficiency, larger groups of cells (e.g., 819 instead of 72) can be selectively arranged in series and parallel.

Because only one type of cell is initially connected in series, power output from other cells in the module 200 are relatively unaffected by spectral shifts causing a decreased output of one type of cell versus another. For example, a 10% reduction of current from one cell type yields a reduction in array current from 1-4.3%, depending upon which cell has reduced solar input. Therefore, the module 200 is less susceptible to output power reductions from spectral shifts that affect response of cell types in an unequal manner when compared to conventional photovoltaic modules.

Figure 3:
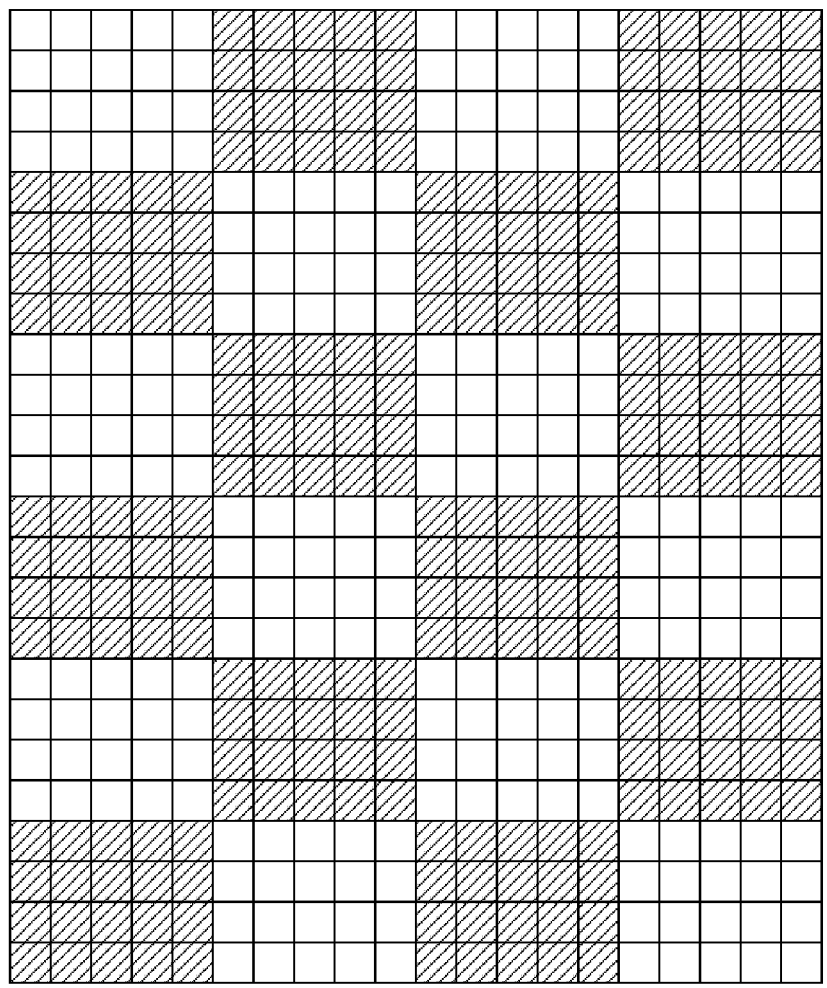
FIG. 3 is a diagram of an exemplary photovoltaic system.

With reference now to FIG. 3, an exemplary photovoltaic system 300 is illustrated. The photovoltaic system 300 comprises 24 photovoltaic module groups, wherein each photovoltaic module group comprises 20 photovoltaic modules that are connected in series. Therefore, if the photovoltaic modules shown in FIG. 3 comprise photovoltaic modules such as the exemplary photovoltaic module 200, the output voltage of any of the photovoltaic module groups is approximately 10.26 volts×20, or approximately 205 volts. The photovoltaic module groups may be connected in parallel with one another, such that shading of a portion of any of the photovoltaic modules in any of the photovoltaic module groups affects current approximately proportionally to space on the photovoltaic module(s) that is subject to shading. Furthermore, size of the photovoltaic system 300 remains relatively small. For example, the photovoltaic system 300 can be approximately 90 cm by 96 cm.

While not shown, the photovoltaic system 300 can further comprise an inverter that transforms the voltage output by the photovoltaic system 300 from DC to AC at a phase desired by a consumer of electric power produced by such system 300. Further, while not shown, the photovoltaic system 300 can comprise microconcentrating optics that are configured to concentrate light from the Sun to the photovoltaic cells. In another exemplary embodiment, rather than undertaking precise voltage matching between cell types, microelectronics can be employed to cause intermediate voltages to be at desired levels. Accordingly, a photovoltaic module can comprise one or more DC to DC converters (with micro power tracking electronics) to cause intermediate output voltages to be approximately equivalent. Moreover, a photovoltaic module can comprise micro inverters that transform DC voltage output by a cell or series of cells into AC voltage. As the cells are relatively small in size, there is sufficient room between cells for adding various microelectronic devices for boosting, conversion, and power tracking.

With reference now to FIG. 4, a cutaway view of an exemplary multi-junction photovoltaic cell 400 is illustrated. The multi-junction photovoltaic cell 400 comprises a plurality of photovoltaic cells: an InGaP cell 402 that initially receives light from the Sun; a GaAs cell 404 immediately adjacent to the InGaP cell; an Si cell 406 that is immediately adjacent to the GaAs cell 404, and a Ge cell 408 that is immediately adjacent to the Si cell 406. Therefore, the multi-junction photovoltaic cell 400 can include a Si cell as well as a III-V cell. It is to be understood that other arrangements are contemplated by the inventors and are intended to fall under the scope of the hereto-appended claims.

Turning now to FIG. 5, an exemplary power system 500 that is configured to provide continuous power to an electromechanical device, such as an unmanned aerial vehicle (UAV), is illustrated. The power system 500 comprises a top encapsulating layer 502, which may include concentrators, for example, that are configured to receive and concentrate light from the Sun. The power system 500 additionally comprises a solar layer 504, which can include one or more of the photovoltaic modules/cells discussed above. The power system 500 further comprises a metallization layer 506 that acts to electrically contact solar cells/modules in the solar layer 504. A flexible support layer 508 can provide structural support for the power system 500. An antenna layer 510 can comprise antennas that, as will be described in greater detail below, can act to harvest energy from non-conventional sources. A flexible support/metallization layer 512 can provide structural support to the antenna layer 510 as well as electrical contacts for the antennas. A thin film battery 514 can retain power generated from the solar layer 504 and/or antenna layer 510, and can dissipate electric power when needed by the electromechanical device. Accordingly, the power system 500 can provide continuous electric power to a continuously operating electromechanical device.

Additional detail pertaining to the layers of the power system 500 will now be provided. Pursuant to an example, the solar layer 504 can comprise a plurality of photovoltaic cells, such as those described above. Additionally or alternatively, the photovoltaic cells can be GaAs cells that have backside-only contacts, such as described in Cruz-Campa, et al., "Back-Contacted and Small Form Factor GaAs Solar Cell", IEEE Photovoltaics Specialists Conference 35, Jun. 21-25, 2010, Pages 1-5, the entirety of which is incorporated herein by reference. In summary, using microsystem/MEMS concepts, thin crystalline silicon and crystalline GaAs PV cells can be included in the solar layer 504. For instance, c-Si cells can be approximately 20 microns thick and have back-side only contacts. Additionally, GaAs cells can be approximately 1-5 µm thick. Once fabricated, such cells can be assembled on a receiving substrate with metallization for connections between the cells. Because the cells are completely fabricated with all anneals prior to being assembled, requirements for the receiving substrate are minimal. Thus, inexpensive, low-temperature materials can be used, opening the door for use of flexible and moldable polymers to act as the substrate.

The antenna layer 508, in an example, may comprise a thermal infrared antenna (IR rectenna) and/or a microwave rectifying antenna array and a focused microwave beam source that is designed for wireless energy transfer. The antenna layer 508 may further comprise microelectronics that facilitates boosting power output from at least one rectifying antenna, such as a DC to DC inverter that is electrically coupled to the rectifying antenna that magnifies DC current output from a rectifying antenna as well as a DC/AC converter that is electrically coupled to the DC to DC inverter that converts the DC current to AC current. These modules can be employed to harvest energy in a night-time environment to support continuous provision of power to an electromechanical device, such as a UAV. That is, such modules can be utilized to supplement energy stored in the thin film battery 514 by the solar layer 504 during daytime photovoltaic operation. The sources of energy in a night-time environment are relatively limited, but include infrared radiation from the earth surface and stray or focused microwave electromagnetic energy from terrestrial sources. Accordingly, the IR antenna can be employed to generate energy based on IR radiation from the surface of the earth. Additionally or alternatively, a microwave rectifying antenna array and focused microwave beam source can be utilized to generate energy based on the terrestrial microwave background. Both of these schemes use rectifying antennas in their respective regions of the electromagnetic spectrum to directly convert incident electromagnetic energy to DC current.

The rectenna, in its simplest form, is a dipole antenna, a transmission line, and a rectifying diode. The incident radiation is collected by the antenna and transferred as a voltage onto a transmission line. The voltage signal at the end of the transmission line is rectified by a Schottky diode and a half wave rectified signal is obtained, which when filtered provides a DC current. Thermal emission from the surface of the earth can be converted to useful energy through use of an IR rectenna that efficiently converts incident IR energy to DC current, which is undertaken by scaling the existing concept of a rectenna to IR frequencies.

Frequency scaling to mid-IR can be accomplished through utilization of a fast diode rectifier that can respond at THz frequencies. For instance, tunneling diodes, such as metal insulator metal tunnel diodes formed at metal junctions, can be employed to rectify mid-IR radiation. To improve efficiency and large area performance of an IR rectenna, a large area resonant metallic IR perfect absorber can be designed that efficiently converts incident IR into bound electromagnetic surface modes (referred to as surface plasmons). A surface plasmon is a charge density excitation on the metal surface that will propagate down very small channels required for rectification. The conversion of the IR radiation into a bound surface Plasmon mode allows for propagation of the IR radiation into nanometer scale channels, which can act as the rectifying metal insulator metal tunnel diode to directly rectify the displacement current in the nanometer channel. The integration of a resonant IR absorber converting the incident radiation to a bound surface mode and its propagation into a rectifying metal insulator metal junction can enable efficient direct conversion of thermal emission of the earth to supplement energy retained in the thin film battery 514.

The thin film battery 514 may be, for example, a printed encapsulated liquid electrolyte battery. Integrated thin film battery sources are increasingly available based on either thin film technology (sputtered micron-thickness films) or coating technology (e.g. doctor blade, 100-500 micron thickness films); these are often limited in discharge rate capability and overall energy density due to packaging and area constraints. The ability to conformally print batteries of desired discharge characteristics on a defined available volume, with minimized packaging material, enables optimization of energy density and substantially maximized performance. Combination of a direct-printed $LiFePO_4$/graphite liquid electrolyte chemistry with a microfabricated 3D current collector and anode (graphite) substrates provides for decreases in battery dead volume from 50% to 20% to improve 340 Wh/kg cells to enable 575 Wh/kg energy densities.

Recently, nanoparticles of nanoscale lithium olivine (e.g. $LiFePO_4$, $LiMnPO_4$) compounds have emerged as positive electrode materials for safe, high-power and long-life lithium rechargeable batteries. In these batteries, lithium is removed from $LiFePO_4$ and intercalated into graphite during charging, and reintercalated into $Li_{1-x}FePO_4$ on discharge. In the nanoscale $LiFePO_4$ compounds, the miscibility gap between two phases has been found to vanish for particles smaller than around 20 nm. This enables rapid charging and discharge without battery degradation or fire, and enables rapid discharge rates required for RF transmission that is not possible in normal high energy but low power lithium batteries. Direct-written batteries of these materials have achieved energy densities of 300 Wh/kg, and a hybrid microfabricated anode/separator with thick film $LiFePO_4$ cathode can achieve 575 Wh/kg by minimization of dead volume (maximum space-filling by elimination of inert packaging and separator content).

To develop direct-written batteries, effective encapsulation can be written on 3D surfaces as well as the active battery components. Recently, the capability to print UV-curable encapsulants based on epoxies and silicones has been developed, as well as printable cathode, anode, and separator chemistries with negligible performance degradation compared to commercial battery materials. Printed flexible silicone and epoxy encapsulants and battery layer thicknesses down to 10 microns (total cell thickness 50-65 microns) have been demonstrated using this fabrication method and design.

Thus, the thin-film battery 514 can be a fully direct written battery (cathode, anode, separator, encapsulant) with $LiFePO_4$, and can be integrated on arbitrary flat or curved surfaces. Microfabricated, 0.4-1 mm thick current collector/anode honeycomb support structures with low dead volume can augment this performance, at the expense of battery flexibility.

In another exemplary embodiment, the thin-film battery 514 may be a Lithium battery. There have been significant advances in the energy and power density of batteries over the past fifty years which have mostly occurred through Edisonian improvements in the materials. These improvements, however, have not been enough to decrease the volume and mass of batteries in autonomous electrically driven systems to the point where they are a minor component. Typically, batteries comprise at least half of the total volume and weight of these systems. In addition, secondary (rechargeable) batteries, such as Li-ion, are desirably charged and discharged tens of thousands of time.

It is widely recognized that the power density limitations of Li-ion batteries is due to kinetic limitations of the cathode material and transport through the dielectric. For example, a pulse laser deposition technique can be used to co-deposit metal-oxide nano-particles (MnO2) and nano-porous carbon. Accordingly, large surface area to volume ratio of the nano-particles can result in a larger surface area to volume than possible with conventional techniques. Also, nano-porous carbon deposited using laser oblation has been shown to result in extremely high grain boundary densities, which are high diffusion paths for Li ions. This technique reduces the need for binders in the carbon, which also allows for more active material, resulting in corresponding improvements in power and energy density.

Ionic liquids hold promise in that they allow for the rapid transport of Li from the anode to the cathode and they have a significantly larger voltage window than aqueous systems. The larger voltage window provides a linear increase in the power density for a giving anode and cathode pairing. Also, if the voltage window is larger than the anode/cathode window, it prevents the formation of the SEI layer on both the anode and cathode, which decreases the amount of non-active Li.

Figure 6:
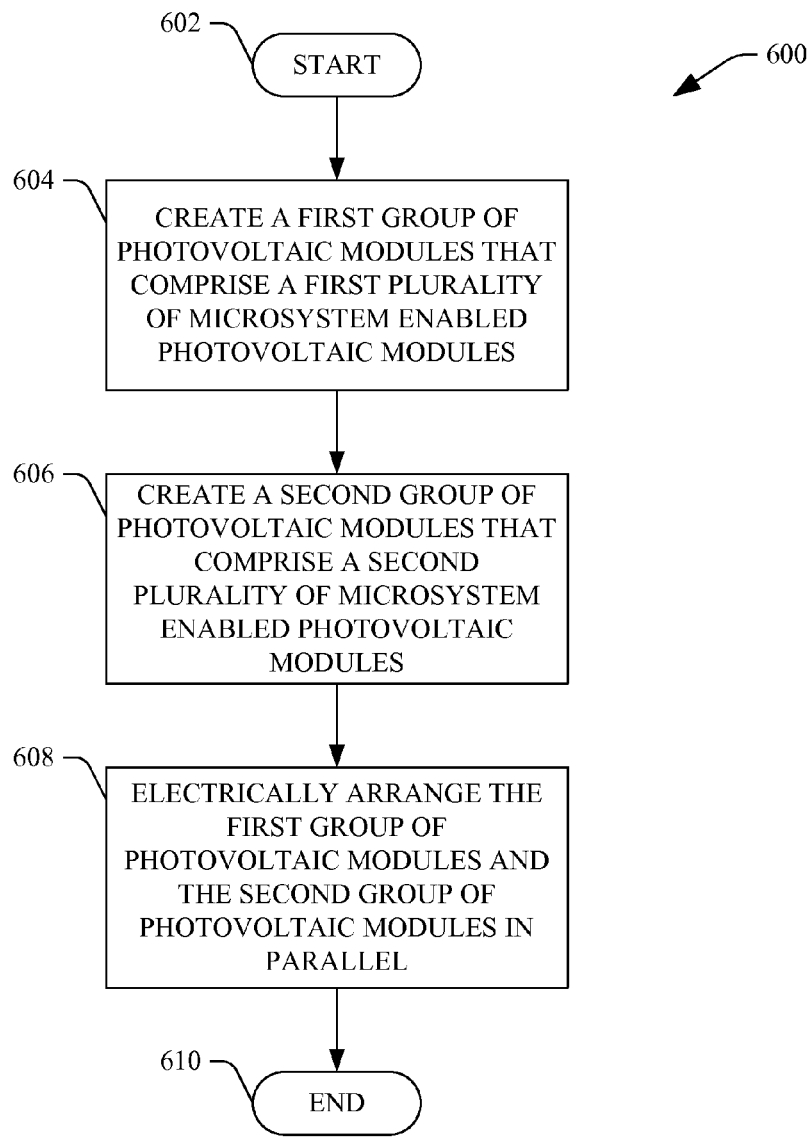
FIG. 6 is flow diagram that illustrates an exemplary methodology for configuring a photovoltaic system.

With reference now to FIG. 6, an exemplary methodology is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement a methodology described herein.

Referring now to FIG. 6 a methodology 600 that facilitates configuring a solar panel is illustrated. The methodology 600 begins at 602, and at 604 a first group of photovoltaic modules is created that comprises a first plurality of microsystem enabled photovoltaic modules arranged in series. At 606, a second group of photovoltaic modules is created that comprises a second plurality of microsystem enabled photovoltaic modules arranged in series. At 608, the first group of photovoltaic modules and the second group of photovoltaic modules are arranged electrically in parallel with one another. The methodology 600 completes at 610.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. A photovoltaic system, comprising:
a first group of photovoltaic modules that comprises a first plurality of photovoltaic modules electrically connected in series, the first plurality of photovoltaic modules comprising a first photovoltaic module that comprises a first plurality of photovoltaic cells that are electrically arranged in series with one another and a second plurality of photovoltaic cells that are electrically arranged in series with one another, the first plurality of photovoltaic cells and the second plurality of photovoltaic cells arranged electrically in parallel with one another; and
a second group of photovoltaic modules that comprises second plurality of photovoltaic modules electrically connected in series, the second plurality of photovoltaic modules comprising a second photovoltaic module that comprises a third plurality of photovoltaic cells that are electrically arranged in series with one another, the first group of photovoltaic modules arranged electrically in parallel with the second group of photovoltaic modules.

2. The photovoltaic system of claim 1, the second photovoltaic module comprising a fourth plurality of photovoltaic cells that are arranged in series with one another, the third plurality of photovoltaic cells arranged electrically in parallel with the fourth plurality of photovoltaic cells.

3. The photovoltaic system of claim 2, the first photovoltaic module comprising a fifth plurality of photovoltaic cells that are arranged in series with one another, the fifth plurality of photovoltaic cells arranged electrically in parallel with the first plurality of photovoltaic cells and the second plurality of photovoltaic cells.

4. The photovoltaic system of claim 3, the second photovoltaic module comprising a sixth plurality of photovoltaic cells that are arranged in series with one another, the sixth plurality of photovoltaic cells arranged electrically in parallel with the third plurality of photovoltaic cells and the fourth plurality of photovoltaic cells.

5. The photovoltaic system of claim 4, the first photovoltaic module comprising a seventh plurality of photovoltaic cells that are arranged in series with one another, the seventh plurality of photovoltaic cells arranged electrically in parallel with the first plurality of photovoltaic cells, the second plurality of photovoltaic cells, and the fifth plurality of photovoltaic cells.

6. The photovoltaic system of claim 5, the second photovoltaic module comprising an eighth plurality of photovoltaic cells that are arranged in series with one another, the eighth plurality of photovoltaic cells arranged in parallel with the third plurality of photovoltaic cells, the fourth plurality of photovoltaic cells, and the sixth plurality of photovoltaic cells.

7. The photovoltaic system of claim 6, wherein as first plurality of multi-junction photovoltaic cells comprises the first plurality of photovoltaic cells, the second plurality of photovoltaic cells, the fifth plurality of photovoltaic cells, and the seventh plurality of photovoltaic cells, respectively, and wherein a second plurality of multi-junction photovoltaic cells comprises the third plurality of photovoltaic cells, the fourth plurality of photovoltaic cells, the sixth plurality of photovoltaic cells, and the eighth plurality of photovoltaic cells, respectively.

8. The photovoltaic system of claim 7, the first and third plurality of photovoltaic cells being InGaP cells, the second and fourth plurality of photovoltaic cells being GaAs cells, the fifth and sixth plurality of photovoltaic cells being Si cells, and the seventh and eighth plurality of photovoltaic cells being Ge cells.

9. The photovoltaic system of claim 1, wherein photovoltaic cells in the first plurality of photovoltaic cells and the third plurality of photovoltaic cells have both positive and negative electrical contacts on a back side of the photovoltaic cells.

10. The photovoltaic system of claim 1, further comprising:
a first plurality of microconcentrating lenses that concentrate solar radiation onto the first plurality of photovoltaic cells; and
a second plurality of microconcentrating lenses that concentrate solar radiation onto the third plurality of photovoltaic cells.

11. The photovoltaic system of claim 1, further comprising:
at least one micro DC to DC converter electrically connected to one of the photovoltaic modules in the first group of photovoltaic modules that boosts DC voltage output by the one of the photovoltaic modules; and
at least one micro inverter that converts DC voltage output from the micro DC to DC converter to AC voltage.

12. A power generating skin that comprises the photovoltaic system of claim 1.

13. The power generating skin of claim 12, further comprising a thin film battery that is electrically connected to the photovoltaic system and receives and retains electric power generated by the photovoltaic system.

14. The power generating skin of claim 13, the thin film battery being one of a liquid electrolyte battery or a lithium battery.

15. The power generating skin of claim 13, further comprising a rectifying antenna that converts electromagnetic energy to DC current, the rectifying antenna electrically connected to the thin film battery.

16. The power generating skin of claim 13, further comprising:
   a rectifying antenna that converts electromagnetic energy to DC current;
   a DC to DC inverter electrically coupled to the rectifying antenna that magnifies DC current output by the rectifying antenna; and
   a DC/AC converter electrically coupled to the DC to DC inverter that converts DC current output from the DC to DC inverter to AC current.

17. The power generating skin of claim 16, the rectifying antenna being one of a thermal rectifying antenna or a microwave rectifying antenna.

18. The power generating skin of claim 13 configured to provide continuous power to an unmanned aerial vehicle.

19. A photovoltaic system, comprising:
   a first group of photovoltaic modules that comprises a first plurality of microsystem enabled photovoltaic modules; and
   a second group of photovoltaic modules that comprises a second plurality of microsystem enabled photovoltaic modules, the first group of photovoltaic modules being electrically connected in parallel to the second group of photovoltaic modules, wherein each microsystem enabled photovoltaic module in the first group of photovoltaic modules and the second group of photovoltaic modules comprising a multi-junction photovoltaic cell that comprises a III-V photovoltaic cell and a silicon photovoltaic cell.

\* \* \* \* \*